United States Patent [19]

Feenstra et al.

[11] Patent Number: 5,110,790
[45] Date of Patent: May 5, 1992

[54] SUPERCONDUCTING THIN FILMS ON POTASSIUM TANTALATE SUBSTRATES

[75] Inventors: Roeland Feenstra; Lynn A. Boatner, both of Oak Ridge, Tenn.

[73] Assignee: Martin Marietta Energy Systems, Inc., Oak Ridge, Tenn.

[21] Appl. No.: 269,410

[22] Filed: Nov. 10, 1988

[51] Int. Cl.[5] .............................................. B32B 9/00
[52] U.S. Cl. ........................................ 505/1; 505/701; 505/702; 505/703; 505/704; 428/688; 428/930; 428/700
[58] Field of Search .................... 505/1, 700, 701, 702, 505/703, 704; 428/688, 930, 700; 252/500

[56] References Cited
PUBLICATIONS

Epitaxial SC Thin Films of $YBa_2Cu_3O_{7-\delta}$ on Potassium Tantalate Single Crystals, Feenstra et al, Appl. Phys. Letters 54(11), 1063-5, 1989, CA 110(22):203867a.

Nondestructive Measurement of Microwave Quanta Energy Using Reactive Nonlinearities, Brasinskii et al, CA 97(12):100827w, 1982.

Very Low-Temperature Search for Supercondutivity in Semiconducting Potassium Tantalate ($KTaO_3$), 1982, CA 97(10):83463e.

Primary Examiner—Patrick J. Ryan
Attorney, Agent, or Firm—J. Donald Griffin; Harold W. Adams

[57] ABSTRACT

A superconductive system for the lossless transmission of electrical current comprising a thin film of superconducting material $Y_1Ba_2Cu_3O_{7-x}$ epitaxially deposited upon a $KTaO_3$ substrate. The $KTaO_3$ is an improved substrate over those of the prior art since the it exhibits small lattice constant mismatch and does not chemically react with the superconducting film.

13 Claims, 3 Drawing Sheets

SUPERCONDUCTING THIN FILMS ON POTASSIUM TANTALATE SUBSTRATES

This invention relates to epitaxial superconducting films on substrates and more specifically to $Y_1Ba_2Cu_3O_7$ thin films on $KTaO_3$ (100) crystal substrates and was developed pursuant to a contract with the United States Department of Energy.

BACKGROUND

In order to successfully develop electrical and electronic devices based on high-temperature superconductors in the $Y_1Ba_2Cu_3O_7$ (Y123) family of materials, it is often necessary to fabricate thin crystallographically oriented films of the superconducting material. Oriented films of this type are particularly necessary for those applications that require the transport of high current densities in the superconducting state.

The preferred method of fabricating oriented thin films is by epitaxial crystallization on a suitable crystalline substrate. A suitable substrate material must have a small lattice constant mismatch relative to the thin film material and, additionally, it must not exhibit any significant degree of chemical reaction with the thin film components either during or after processing. It is difficult to find a substrate material that meets both criteria.

In the case of fabrication of thin films of the $Y_1Ba_2Cu_3O_7$ family of materials, including those materials in which trivalent rare earths are substituted for the element yttrium, the substrates that have been previously employed include $SrTiO_3$, MgO, cubic $ZrO_2$, and $Al_2O_3$. The best results were obtained with $SrTiO_3$, however, Sr and Ti can migrate into and react with the superconductor film. Less satisfactory results were found for the other noted substrate materials. Although these materials are stable, they either exhibit unfavorable reactions at the interface or effects that lower the critical temperature of the superconductor. They are not conducive to controlled film orientation and they are relatively difficult to produce; therefore, there is a continuing need to provide a substrate material that has the desired properties.

SUMMARY OF THE INVENTION

In view of the above needs it is an object of this invention to provide a superconducting system wherein a superconducting film is epitaxially oriented on substrate.

Another object of the invention is to provide a superconducting system that is relatively easy to produce.

An additional object of this invention is to provide a superconducting system with controlled film orientation.

It is a further object of this invention to provide a superconducting system wherein an epitaxially oriented superconducting film is on a substrate that will not chemically react with the superconducting material.

Another object is to provide a composition that comprises a superconducting thin film epitaxially applied to a semiconducting substrate. Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects and in accordance with the purpose of the present invention, as embodied and broadly described herein, the composition of matter of this invention may comprise a superconducting film epitaxially deposited on a $KTaO_3$ substrate. The substrate may also be a niobium containing compound where some of the tantalum of $KTaO_3$ is replaced by niobium, resulting in a solid solution crystal potassium tantalate niobiate. The preferred superconductor is the $Y_1Ba_2Cu_3O_7$ family of materials, where is from 0 to and the preferred substrate is $KTaO_3$. The composition exhibits a good lattice match with no undesirable reactivity between the film and the substrate.

DETAILED DESCRIPTION OF THE PREFERRED EMBODIMENT

Figure 1:
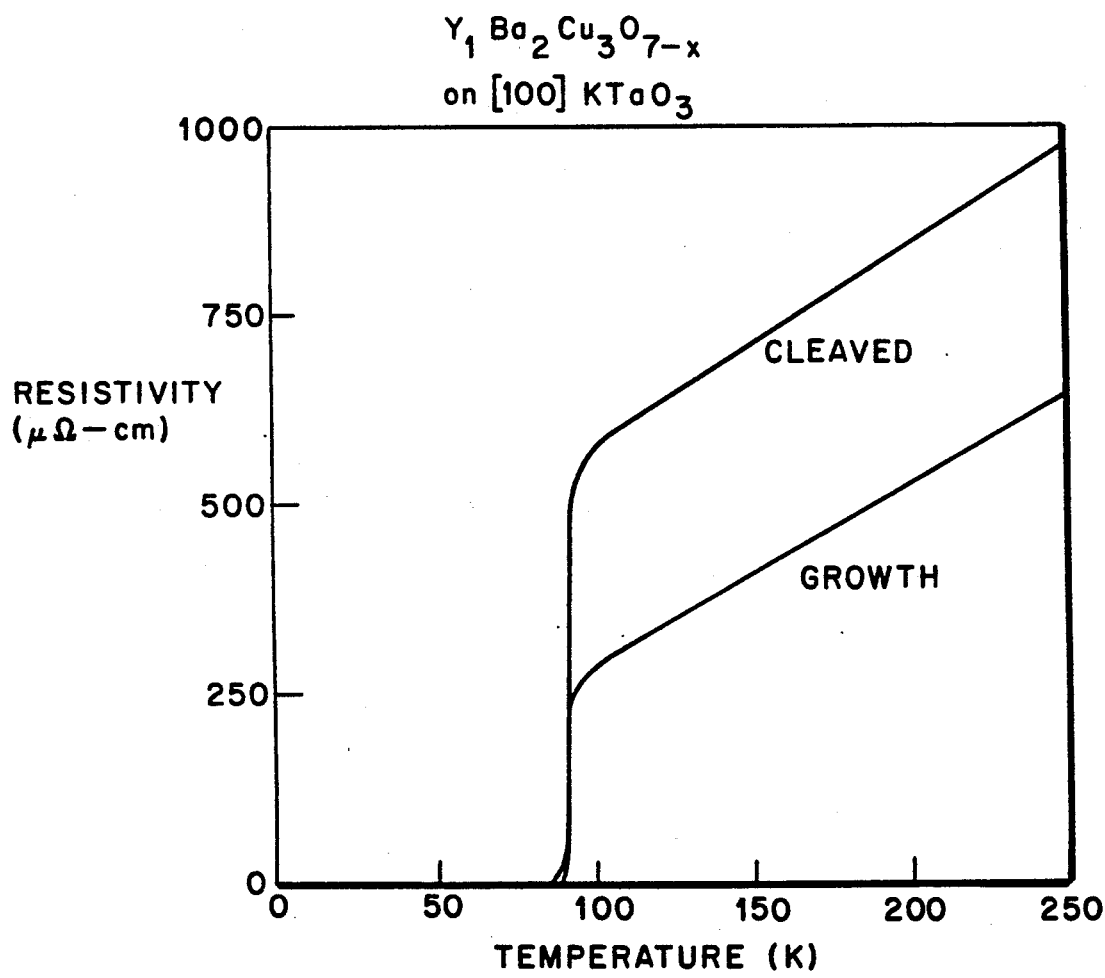
FIG. 1 shows the results of measurements of resistivity versus temperature for epitaxial thin films 300 to 400 nm thick formed on both cleaved and growth surfaces of potassium tantalate single crystals.

This invention is a new thin film and $KTaO_3$ substrate combination with epitaxially oriented thin superconducting films of the Y123 family of material, including the rare earth substituted analogs such as $Ho_1Ba_2Cu_3O_7$. The new thin film/substrate combination consists of a thin superconducting film formed by the deposition of either the elements or their compounds of yttrium, or a trivalent rare earth, barium, copper and oxygen on a crystalline substrate of (100) oriented potassium tantalate.

The potassium tantalate provides an atomic template with a suitable lattice constant and structure for the nucleation and growth of an oriented epitaxial thin film of the Y123 family of high critical temperature superconducting material. The a- and b-axis of the unit cell of the superconductor are of compatible lengths, 3.81 and 3.88 Å, to be a good fit with the unit cell of the $KTaO_3$ substrate which is cubic having a side dimension of 3.99 Å. The c-axes of the unit cell of the superconductor is 11.6 Å, or approximately 3 times the length of the $KTaO_3$ unit cell, which also results in good lattice match characteristics. Additionally, the chemical reactivity between the $KTaO_3$ substrate and the Y123 superconducting thin film is very low, and the superconducting properties of the thin film are not adversely affected by contamination arising from the elements present in the substrate.

In the preferred embodiment of the invention, superconducting thin films with high current carrying capacity in the superconducting state are made by co-evaporation of yttrium, barium fluoride, and copper, or other chemical forms of yttrium, barium, and copper, in an oxygen environment or in a vacuum. The as-deposited films are subsequently annealed in wet oxygen in order to react the deposited components and thereby form the Y123 superconducting compound. It should be noted that this represents only one fabrication path and that any standard, conventional deposition technique such as magnetron sputtering, rf sputtering, laser ablation, molecular beam deposition, chemical vapor deposition, etc. can be used for the initial step of depositing the film or its components on a $KTaO_3$ crystalline substrate.

The crystalline substrate surface can be either a crystal growth surface, a cleaved surface or a substantially polished surface. In the preferred embodiment, the thin superconducting films formed epitaxially on $KTaO_3$ substrates were metallic and had a critical temperature for superconductivity at about 90 K.

Films can be formed with either the a- and b-axes of the Y123 unit cell parallel to the in-plane (100) and (010) axes of the potassium tantalate crystalline substrate with the c-axis of the superconducting film perpendicular to the surface of the substrate. Alternatively, Y123 films can be made with the b- and c-axes parallel to the in-plane fourfold axes of the $KTaO_3$ crystalline substrate, in other words, with the c-axis of the Y123 superconducting film parallel to the surface of the substrate. In general the superconducting films comprise a mixture of both types of orientation. In general, when prepared under the same conditions, epitaxial thin films on $KTaO_3$ have more crystalline grains with the c-axis oriented perpendicular to the plane of the film than films formed on $SrTiO_3$ crystalline substrates. Such an orientation allows for high critical currents which is important for certain applications using high current densities.

The superconducting transition occurs over a very narrow temperature range for Y123 epitaxial films formed on $KTaO_3$ crystalline substrates. It is also possible to grow thin films that contain $Y_2Ba_4Cu_8O_{20}$ (Y248) on crystalline substrates of $KTaO_3$. The Y248 phase is epitaxial with the c-axis perpendicular to the plane of the thin film. In the case of a Y123 epitaxial thin film with a mixture of a-perpendicular and c-perpendicular grains, the critical current densities at 77 K in zero magnetic field have been found to exceed $10^5$ amps/$cm^2$. Films formed on cleaved surfaces of $KTaO_3$ have a tendency to contain more grains with the a-axes perpendicular than epitaxial thin films formed on growth surfaces. In both cases, however, the same superconducting transition temperature of about 90 K is obtained.

The basic overall characteristics of the microstructure of thin films formed on crystalline $KTaO_3$ (100) surfaces appear to be similar to those for films formed on $SrTiO_3$ crystals of the same orientation. The potassium tantalate single crystal substrates can be formed by a high temperature growth process in which an excess of $K_2O$ is maintained in order to control the stoichiometry of the material. Thin superconducting epitaxial films of the Y123 family of materials can also be formed on semiconducting $KTaO_3$. Potassium tantalate can be made semiconducting with varying carrier concentrations by the addition of appropriate amounts of either alkaline earth oxides, some rare earth oxides and some other metal oxides during the growth or synthesis process.

EXAMPLE

Figure 2:
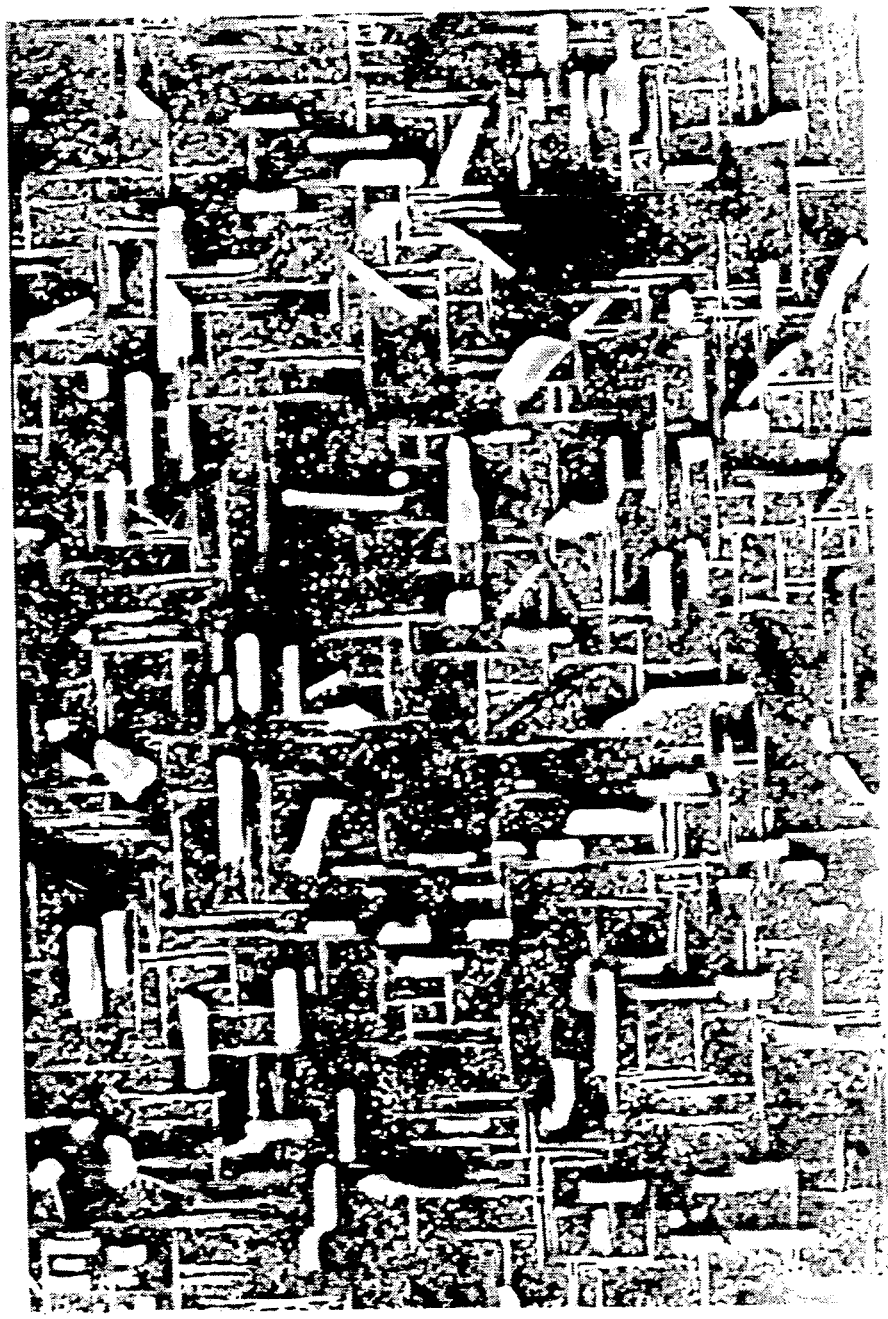
FIG. 2 shows a scanning electron micrograph of surfaces of thin superconducting films of Y123 formed on a growth surface of $KTaO_3$.
Figure 3:
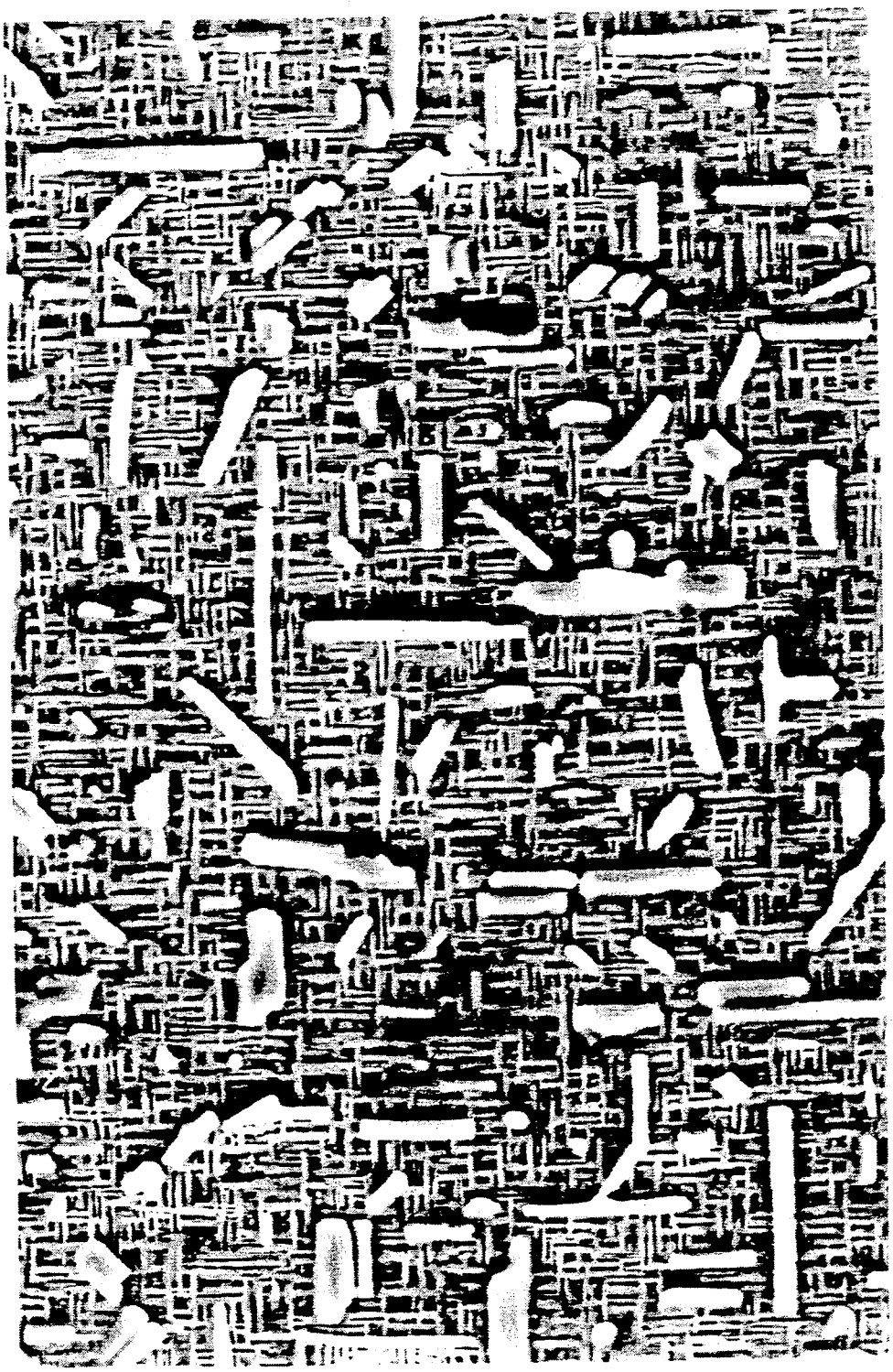
FIGS. 3 shows a scanning electron micrograph of surfaces of thin superconducting films of Y123 formed on a cleaved surface of $KTaO_3$.

FIG. 1 shows the results of measurements of resistivity versus temperature for epitaxial thin films 300 to 400 nm thick formed on both cleaved and growth surfaces of potassium tantalate single crystals. The nominal composition of the Y123 thin film is very close to the ideal stoichiometric value. The films were annealed in flowing wet oxygen for thirty minutes at 850° C. They were then annealed in dry oxygen at 550° C. for one hour to enhance the uptake of oxygen by the compound and thereby form the superconducting form of the material. As shown in FIG. 1, the superconducting transition for the films formed on both cleaved and growth surfaces occurs at about 90 K. FIGS. 2 and 3 show scanning electron micrographs of surfaces of thin superconducting films of Y123 formed on growth and cleaved surfaces of $KTaO_3$ respectively. Superconducting grains that have the a-axis perpendicular to the substrate appear as thin rectangular plates that are parallel to the fourfold symmetry directions of $KTaO_3$ single crystal substrate. The "pebble-grained" background area around the thin rectangular bars consists of material for which the grains have the c-axis oriented perpendicular to the surface of the substrate and thin film. Deposits on the cleaved surfaces tend to have more grains with the a-axis oriented perpendicular to the surface, whereas the deposits on the growth surfaces tend to favor grains with the c-axis oriented perpendicular to the surface. The different morphology and ratio of the axis orientations in the two cases of films formed on cleaved and growth surfaces is related to the differences in the electron transport properties illustrated in FIG. 1. These morphological differences have also been confirmed by means of x-ray diffraction techniques.

In alternative applications, the $KTaO_3$ crystalline substrates can be used to support epitaxial thin films of high temperature superconductors in which the element yttrium is replaced by any of the trivalent rare earth elements or by scandium. Crystalline substrates can also be formed in which the element tantalum is replaced by niobium to form the solid solution crystal potassium tantalate niobiate, $KTa_{1-2}Nb_2O_3$. This material will undergo a ferroelectric phase transition at varying temperatures depending on the concentration of niobium relative to tantalum. This permits the fabrication of a ferroelectric and electrooptic single crystal material. The ability to form the epitaxial film is not dependent in general on the initial method used to deposit the high temperature Y123 superconducting compound or on the chemical form of the components that are to be reacted to form such a compound.

One advantage of using $KTaO_3$ as the substrate is that the crystals are relatively large and therefore inexpensive to make. Not only are they inexpensive to make, but the crystals can also be grown with high optical quality making them suitable for optoelectronic devices where high temperature superconductivity is desired. In addition, the combination of thin film superconductor and substrate can withstand relatively high temperatures to between 800° C. to 900° C., which would be necessary when used in electrical devices that may cycle to elevated temperatures when not operating in the high temperature superconductivity temperature range. Also, the $KTaO_3$ substrate can be doped with alkaline earth impurities during crystal growth to make it a semiconductor which has application in the formation of logic circuits and/or superconducting memory devices for high-speed computer applications. $KTaO_3$ may also be employed either in crystalline or amorphous form to produce an inert barrier between a thin film of Y123 type material and other substrates such as silicon or between two films with one or both films being a high $T_c$ material. The development is potentially useful in a wide range of energy-related devices, electronic circuitry, logic devices, memories, sensors, detectors, switches, and electrooptic devices.

We claim:

1. A composition for the lossless transmission of electrical current comprising a superconducting thin film epitaxially deposited on a oriented surface of a single crystal $KTa_{1-z}Nb_zO_3$ substrate, where z is 0 to 1, wherein said superconducting thin film is selected from the group consisting of $YBa_2Cu_3O_7$, $Y_2Ba_4Cu_8O_{20}$, a compound wherein a trivalent rare earth element replaces yttrium in compound $YBa_2Cu_3O_7$, and a compound wherein scandium replaces yttrium in the compound $YBa_2Cu_3O_7$.

2. The composition of claim 1 wherein said substrate is semiconducting.

3. The composition of claim 1 wherein said film is deposited on a growth surface of said substrate.

4. The composition of claim 1 wherein said film is deposited on a cleaved surface of said substrate.

5. The composition of claim 1 wherein said film is deposited on a polished surface of said substrate.

6. The composition of claim 1 wherein said crystal is optically transparent.

7. The composition of claim 1 wherein said substrate is $KTaO_3$.

8. A composition for the lossless transmission of electrical current comprising a superconducting thin film epitaxially deposited on a oriented surface of a single crystal $KTaO_3$ substrate, wherein said superconducting thin film is selected from the group consisting of $Y_1Ba_2Cu_3O_7$, $Y_2Ba_4Cu_8O_{20}$, a compound wherein a trivalent rare earth element replaces yttrium in the compound $Y_1Ba_2Cu_3O_7$, and a compound wherein scandium replaces yttrium in the compound $Y_1Ba_2Cu_3O_7$.

9. The composition of claim 8 wherein said substrate is semiconducting.

10. The composition of claim 8 wherein said superconducting film is deposited on a growth surface of said substrate.

11. The composition of claim 8 wherein said superconducting film is deposited on a cleaved surface of said substrate.

12. The composition of claim 8 wherein said superconducting film is deposited on a polished surface of said substrate.

13. The composition of claim 8 wherein said single crystal substrate is optically transparent.

* * * * *